United States Patent
Uneme et al.

(10) Patent No.: US 12,491,780 B2
(45) Date of Patent: Dec. 9, 2025

(54) VEHICLE POWER CONVERSION DEVICE

(71) Applicant: HONDA MOTOR CO., LTD., Tokyo (JP)

(72) Inventors: Takahiro Uneme, Tokyo (JP); Mayuka Araki, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 305 days.

(21) Appl. No.: 18/369,413

(22) Filed: Sep. 18, 2023

(65) Prior Publication Data

US 2024/0092200 A1    Mar. 21, 2024

(30) Foreign Application Priority Data

Sep. 21, 2022    (JP) ................. 2022-150435

(51) Int. Cl.
*H05K 7/14*    (2006.01)
*B60L 53/22*    (2019.01)
*B60L 58/20*    (2019.01)

(52) U.S. Cl.
CPC ............. *B60L 53/22* (2019.02); *B60L 58/20* (2019.02); *H05K 7/14322* (2022.08); *B60L 2210/10* (2013.01)

(58) Field of Classification Search
CPC ...... B60L 53/22; B60L 58/20; B60L 2210/10; B60L 50/16; H05K 7/14322

(Continued)

(56) References Cited

U.S. PATENT DOCUMENTS 5,915,488 A * 6/1999 Fliege .................. B60L 3/0007
                                                180/65.265
6,496,393 B1 * 12/2002 Patwardhan .......... H02M 7/003
                                                363/70
(Continued)

FOREIGN PATENT DOCUMENTS

JP     2013-103584 A     5/2013
JP     2017-157455 A     9/2017
(Continued)

OTHER PUBLICATIONS

Mar. 12, 2024, Translation of Japanese Office Action issued for related JP Application No. 2022-150435.

(Continued)

*Primary Examiner* — Zhengfu J Feng
(74) *Attorney, Agent, or Firm* — Paratus Law Group, PLLC

(57) ABSTRACT

A vehicle power conversion device is mounted in a front room of a vehicle. The vehicle power conversion device has a DCDC converter, an accommodating case configured to accommodate the DCDC converter, and a connector unit provided on the accommodating case. First and second protruding portions are provided in a front region of the accommodating case. The connector unit is provided such that, as viewed in an upper-lower direction, the connector unit is located behind a first virtual line which is a common tangent line of the first protruding portion and the second protruding portion, and at least a part of the connector unit is located in a left-right direction between a first contact point in which the first virtual line is in contact with the first protruding portion, and a second contact point in which the first virtual line is in contact with the second protruding portion.

6 Claims, 5 Drawing Sheets

(58) Field of Classification Search
USPC ........................................................ 361/600
See application file for complete search history.

(56) References Cited

U.S. PATENT DOCUMENTS

| | | | | |
|---|---|---|---|---|
| 6,898,299 | B1* | 5/2005 | Brooks | G07C 9/37 340/5.82 |
| 2003/0230443 | A1* | 12/2003 | Cramer | B62D 21/152 180/65.51 |
| 2005/0073433 | A1* | 4/2005 | Gunderson | G01S 13/931 340/903 |
| 2005/0161809 | A1* | 7/2005 | Nakatsu | H02M 7/003 257/734 |
| 2005/0162015 | A1* | 7/2005 | Yamaguchi | B60R 16/0215 307/10.1 |
| 2006/0086981 | A1* | 4/2006 | Yamaguchi | H02M 7/003 257/347 |
| 2006/0225781 | A1* | 10/2006 | Locher | H10F 19/00 257/E31.11 |
| 2013/0220718 | A1 | 8/2013 | Gotou et al. | |
| 2017/0253126 | A1 | 9/2017 | Katano et al. | |
| 2022/0176896 | A1 | 6/2022 | Uneme et al. | |

FOREIGN PATENT DOCUMENTS

| | | |
|---|---|---|
| JP | 2018-114899 A | 7/2018 |
| JP | 2022-089680 A | 6/2022 |
| WO | WO 2012/060195 A1 | 5/2012 |

OTHER PUBLICATIONS

Audi of America, LLC, The 2019 Audi e-tron Introduction eSelf-Study Program 990993, Jan. 2019, pp. i-iv and 88-97, United States of America.

* cited by examiner

VEHICLE POWER CONVERSION DEVICE

CROSS-REFERENCE TO RELATED APPLICATIONS

This application is based on and claims priority under 35 USC 119 from Japanese Patent Application No. 2022-150435 filed on Sep. 21, 2022, the contents of which are incorporated herein by reference.

TECHNICAL FIELD

The present disclosure relates to a vehicle power conversion device mounted on an electric vehicle or the like.

BACKGROUND ART

In recent years, efforts have been made to realize a low-carbon society or a decarbonized society. In a field of vehicles, research and development of electric vehicles with electrified drive sources are in progress in order to reduce an amount of $CO_2$ emission and improve energy efficiency.

A power conversion device is mounted on an electric vehicle or the like. The power conversion device, for example, converts DC power stored in a battery into three-phase AC power for driving a rotary electric machine that is a drive source of the electric vehicle, and steps down the DC power stored in the battery to an operating voltage of each electrical component such as an auxiliary machine mounted on the electric vehicle. For example, JP2022-089680A discloses a vehicle in which an assembly of a power control unit and a motor unit is mounted as a power conversion device.

A power supply cable connected to a battery is connected to an electronic control unit disclosed in JP2022-089680A. The power supply cable is connected to the electronic control unit by fitting a cable-side connector into a unit-side connector of the electronic control unit. A unit-side terminal provided in the unit-side connector of the electronic control unit is connected to an electronic component inside the power control unit.

In the electronic control unit disclosed in JP2022-089680A, an object may collide with the electronic control unit due to a collision of a vehicle or the like. However, in the electronic control unit disclosed in JP2022-089680A, when an object collides with the electronic control unit, a load such as an impact is transmitted from the unit-side connector, and the load such as the impact may be applied to the electronic component inside the power control unit.

SUMMARY OF INVENTION

The present disclosure provides a vehicle power conversion device capable of preventing a load from being applied to a connector unit provided on an accommodating case even when an object collides from a vehicle front side due to a collision of a vehicle or the like.

An aspect of the present disclosure relates to a vehicle power conversion device mounted in a front room of a vehicle, the vehicle power conversion device including:
 a DCDC converter;
 an accommodating case configured to accommodate the DCDC converter; and
 a connector unit provided on the accommodating case,
 in which a first protruding portion and a second protruding portion are provided in a front region of the accommodating case, and
 the connector unit is provided such that, as viewed in an upper-lower direction, the connector unit is located behind a first virtual line which is a common tangent line of the first protruding portion and the second protruding portion, and at least a part of the connector unit is located in a left-right direction between a first contact point in which the first virtual line is in contact with the first protruding portion, and a second contact point in which the first virtual line is in contact with the second protruding portion.

According to the present disclosure, even when an object collides from a vehicle front side due to a collision of the vehicle or the like, the first protruding portion and the second protruding portion can prevent a load from being applied to the connector unit provided on the accommodating case.

BRIEF DESCRIPTION OF DRAWINGS

Exemplary embodiment(s) of the present invention will be described in detail based on the following figures, wherein.

DESCRIPTION OF EMBODIMENTS

Figure 1:
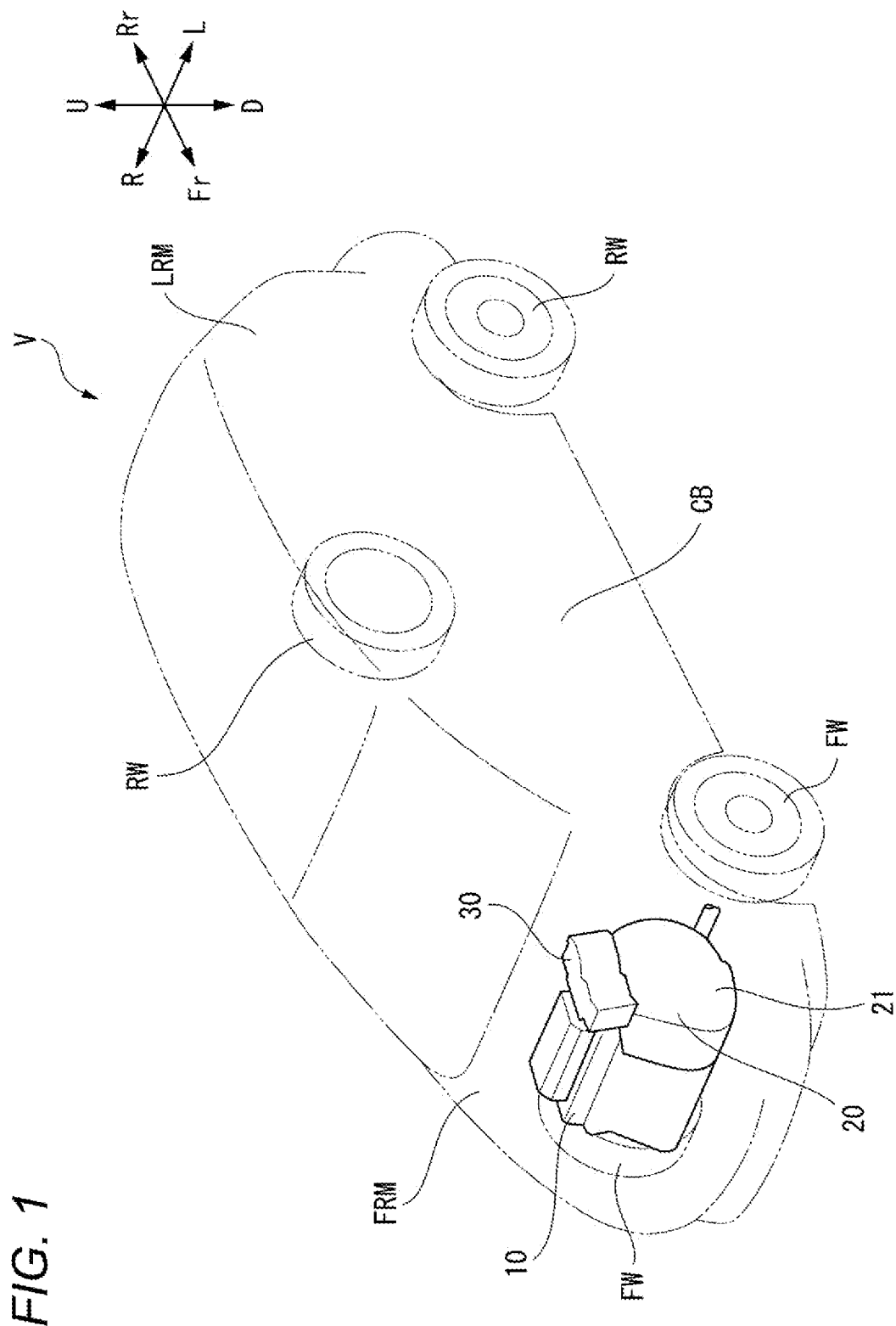
FIG. 1 is a schematic perspective view of a vehicle equipped with a power control unit, which is a vehicle power conversion device according to an embodiment of the present disclosure, as viewed obliquely from above.

Hereinafter, a vehicle equipped with a vehicle power conversion device according to an embodiment of the present disclosure will be described with reference to the accompanying drawings. The drawings are viewed in directions of reference numerals. In the present specification and the like, in order to simplify and clarify the description, front-rear, left-right, and upper-lower directions are described according to directions viewed from a driver of the vehicle equipped with the vehicle power conversion device, and in the drawings, a front side of the vehicle is denoted by Fr, a rear side is denoted by Rr, a left side is denoted by L, a right side is denoted by R, an upper side is denoted by U, and a lower side is denoted by D. In the present specification and the like, the left-right direction is also referred to as a vehicle width direction, <Vehicle>

As shown in FIG. 1, a vehicle V according to the present embodiment includes a cabin CB that is a living space for an occupant, a front room FRM provided in front of the cabin CB, and a luggage room LRM provided behind the cabin CB. The cabin CB and the front room FRM are separate spaces partitioned by a dash panel (not shown) or the like. In the present embodiment, the luggage room LRM is not partitioned from the cabin CB, and is a space communicating with the cabin CB. The luggage room LRM and the cabin CB may be separate spaces, or may partially communicate with each other.

The vehicle V is provided with a pair of left and right front wheels FW on the front side and a pair of left and right rear wheels RW on the rear side.

An engine 10, a drive device 20, and a power control unit 30 are mounted in the front room FRM of the vehicle V The engine 10 and the drive device 20 are disposed adjacent to each other in the vehicle width direction in the front room FRM. In the present embodiment, the engine 10 and the drive device 20 are disposed adjacent to each other in the vehicle width direction in the front room FRM such that the engine 10 is on a right side and the drive device 20 is on a left side. The power control unit 30 is fixed to an upper portion of the drive device 20.

An output shaft of the engine 10 is coupled to the drive device 20.

The drive device 20 includes a drive device case 21. A first rotary electric machine (not shown), a second rotary electric machine (not shown), and a power transmission mechanism (not shown) are accommodated in the drive device case 21.

The drive device 20 includes a transmission path that transmits rotational power of the engine 10 to the front wheels FW that are driven wheels via the power transmission mechanism to cause the vehicle to travel, and a transmission path that transmits the rotational power of the engine 10 to the first rotary electric machine via the power transmission mechanism to drive the second rotary electric machine while generating power with the first rotary electric machine and transmits rotational power of the second rotary electric machine to the front wheels FW that are the driven wheels via the power transmission mechanism to cause the vehicle to travel. The vehicle V travels by driving the front wheels FW, which are the driven wheels, by selectively selecting one of the two transmission paths in the drive device 20 or using the two transmission paths in combination.

The power control unit 30 is connected between a high-voltage battery (not shown) mounted on the vehicle V and the drive device 20. In the present embodiment, the power control unit 30 is an example of the power conversion device according to the present disclosure.

Figure 2:
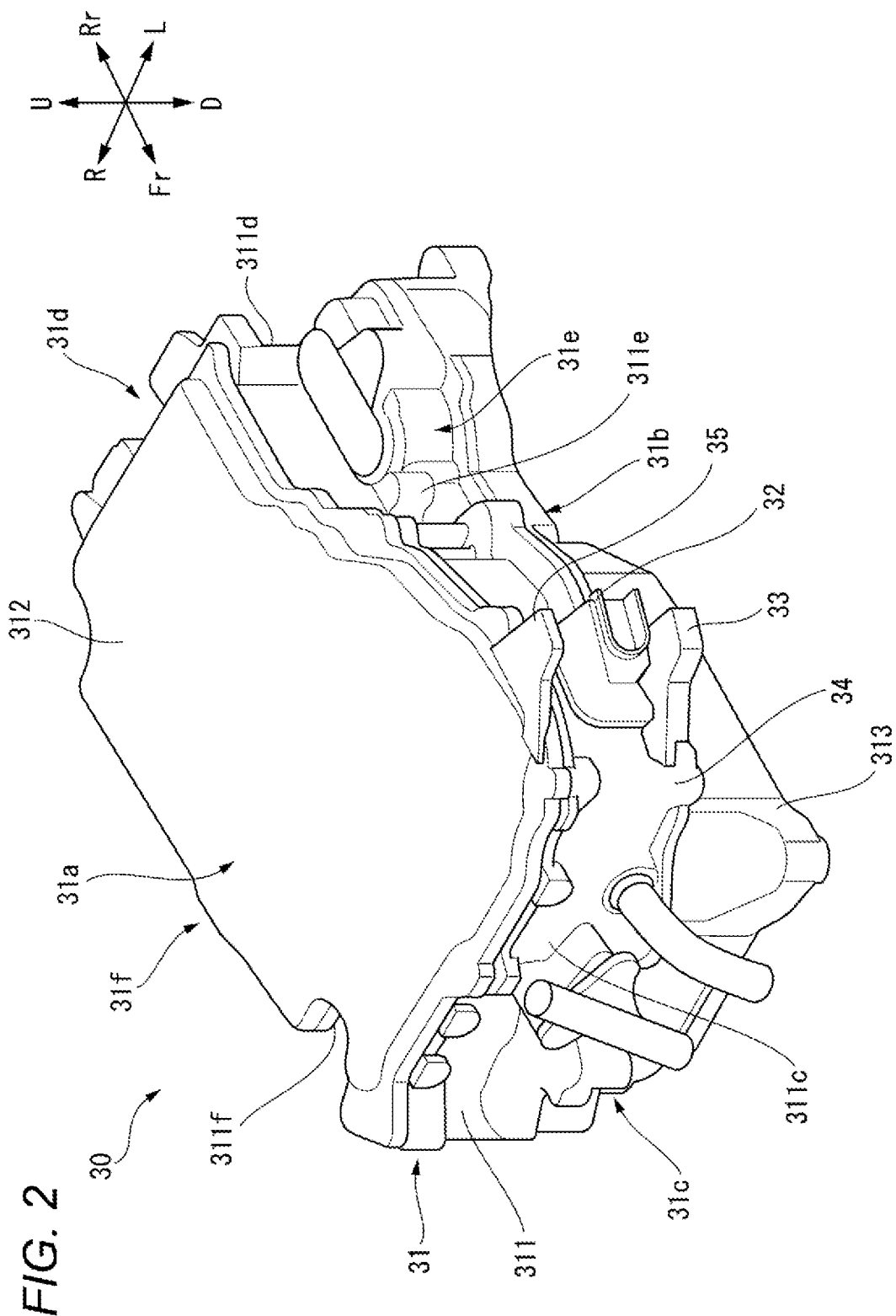
FIG. 2 is a perspective view of the power control unit, which is the vehicle power conversion device according to the embodiment of the present disclosure, as viewed obliquely from above.
Figure 3:
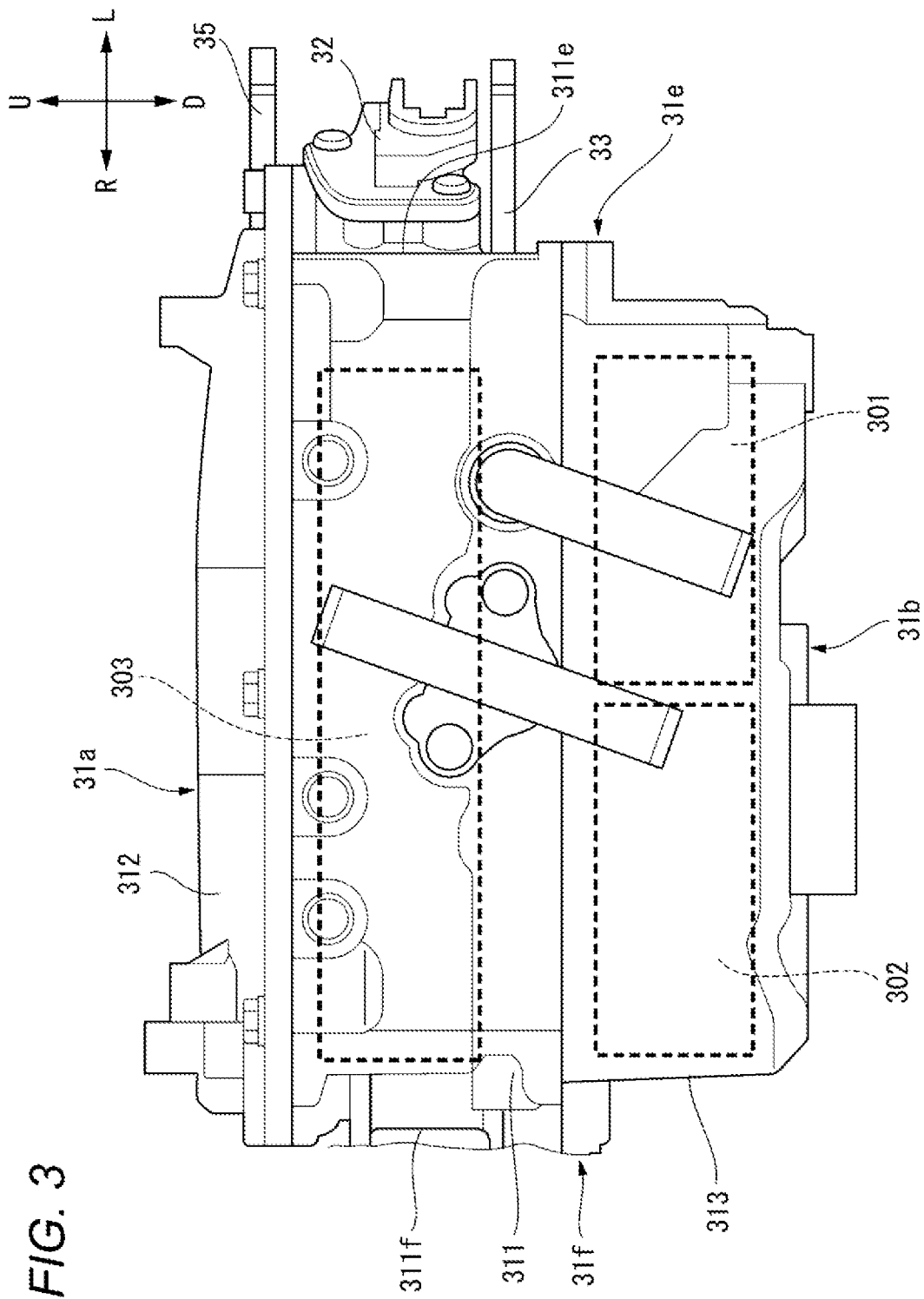
FIG. 3 is a front view of the power control unit in FIG. 2 as viewed from a front side.
Figure 4:
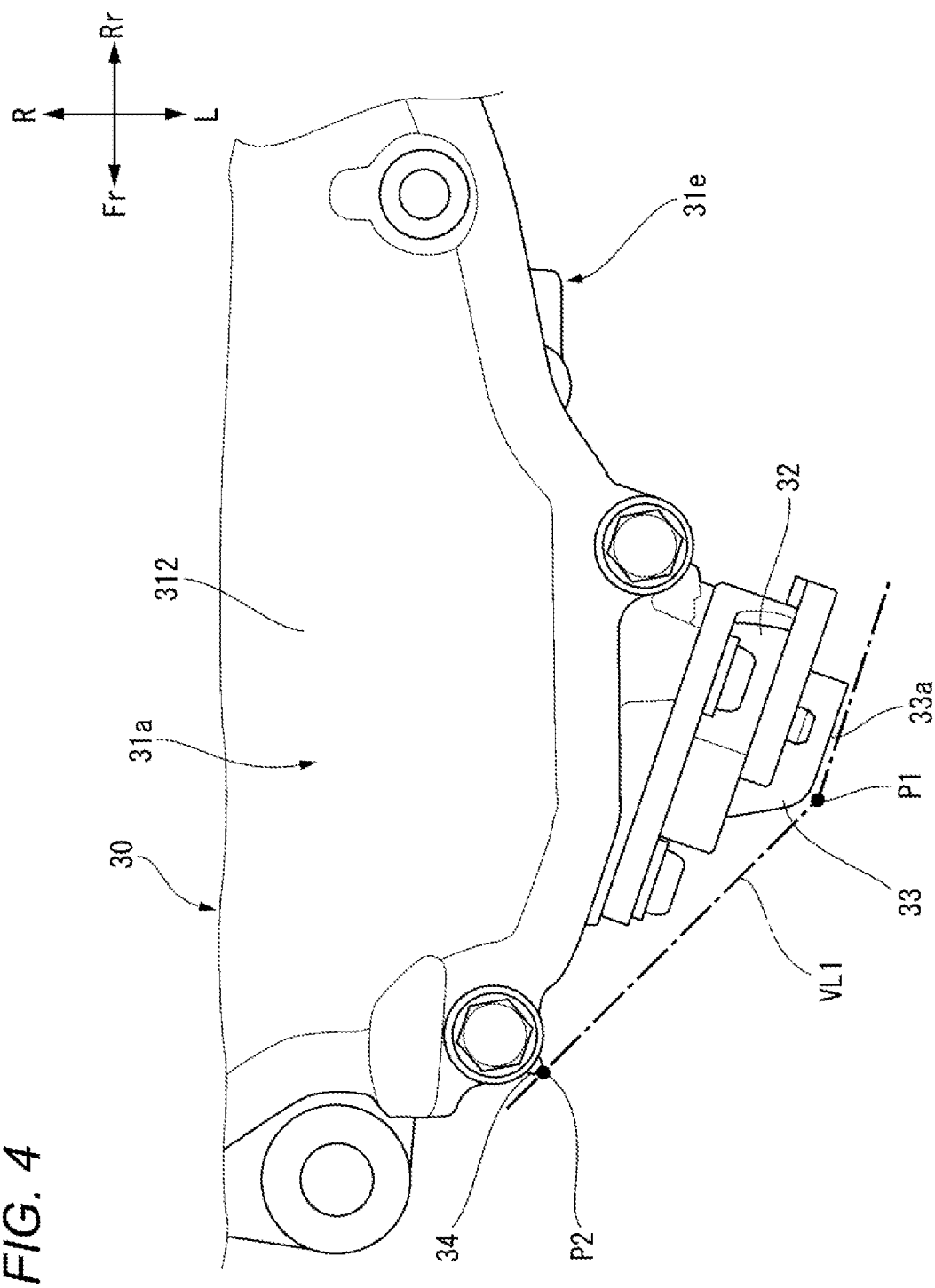
FIG. 4 is a top view of the power control unit in FIG. 2 as viewed from above with a third protruding portion omitted.

As shown in FIGS. 2 to 4, the power control unit 30 includes a voltage control unit 301, an inverter 302, a DCDC converter 303, an accommodating case 31, and a low-voltage connector unit 32 provided on the accommodating case 31.

The voltage control unit 301 is electrically connected to the high-voltage battery and boosts a voltage V1, which is an output voltage of the high-voltage battery, to a voltage V2, which is an input voltage when the second rotary electric machine operates as an electric motor, and steps down power at the voltage V2, which is generated by the second rotary electric machine and converted into a direct current by driving of the engine 10, to power at the voltage V1.

The inverter 302 includes a first inverter unit (not shown) connected to the voltage control unit 301 and the first rotary electric machine, and a second inverter unit (not shown) connected to the voltage control unit 301 and the second rotary electric machine.

The first inverter unit converts AC power generated by the first rotary electric machine by the driving of the engine 10 into DC power at the voltage V2. Then, the DC power at the voltage V2 converted by the first inverter unit is stepped down to the voltage V1 by the voltage control unit 301, and the high-voltage battery is charged.

The second inverter unit converts the DC power output from the high-voltage battery and boosted to the voltage V2 by the voltage control unit 301 into three-phase AC power.

The three-phase AC power converted by the second inverter unit is supplied to the second rotary electric machine, and the second rotary electric machine is driven.

The DCDC converter 303 is electrically connected to the high-voltage battery in parallel with the voltage control unit 301, and is also electrically connected to the low-voltage connector unit 32. The DCDC converter 303 steps down the voltage V1, which is the output voltage of the high-voltage battery, to $V_{Low}$, which is an operating voltage of each electrical component of the vehicle. $V_{Low}$ is, for example, 12 [V].

The accommodating case 31 accommodates the voltage control unit 301, the inverter 302, and the DCDC converter 303.

The accommodating case 31 includes an upper wall portion 31a, a lower wall portion 31b, a front wall portion 31c, a rear wall portion 31d, a left wall portion 31e, and a right wall portion 31f.

The accommodating case 31 includes an intermediate member 311 surrounding the voltage control unit 301, the inverter 302, and the DCDC converter 303 as viewed in the upper-lower direction, an upper member 312 disposed at an upper portion of the intermediate member 311 and covering an upper side of the voltage control unit 301, the inverter 302, and the DCDC converter 303, and a lower member 313 disposed at a lower portion of the intermediate member 311 and covering a lower side of the voltage control unit 301, the inverter 302, and the DCDC converter 303. The upper member 312 is fixed to an upper end portion of the intermediate member 311 by bolts or the like. The lower member 313 is fixed to a lower end portion of the intermediate member 311 by bolts or the like.

The upper wall portion 31a of the accommodating case 31 is formed by the upper member 312. The lower wall portion 31b of the accommodating case 31 is formed by the lower member 313. In each of the front wall portion 31c, the rear wall portion 31d, the left wall portion 31e, and the right wall portion 31f of the accommodating case 31, an upper region is formed by the upper member 312, a lower region is formed by the lower member 313, and an intermediate region in the upper-lower direction between the upper region and the lower region is formed by the intermediate member 311.

The intermediate member 311 includes a front wall portion 311c, a rear wall portion 311d, a left wall portion 311e, and a right wall portion 311f. The front wall portion 311c extends in the upper-lower direction and the left-right direction in front of the voltage control unit 301, the inverter 302, and the DCDC converter 303. The rear wall portion 311d extends in the upper-lower direction and the left-right direction behind the voltage control unit 301, the inverter 302, and the DCDC converter 303. The left wall portion 311e extends rearward from a left end portion of the front wall portion 311c to a left end portion of the rear wall portion 311d in the upper-lower direction and the front-rear direction. The right wall portion 311f extends rearward from a right end portion of the front wall portion 311c to a right end portion of the rear wall portion 311d in the tipper-lower direction and the front-rear direction.

The low-voltage connector unit 32 is provided in a front region of the accommodating case 31. The low-voltage connector unit 32 is provided in a front region of the left wall portion 31e of the accommodating case 31 behind the front wall portion 31c of the accommodating case 31. In the present embodiment, the low-voltage connector unit 32 is provided on the intermediate member 311. Therefore, the low-voltage connector unit 32 is provided in a front region of the left wall portion 311e of the intermediate member 311. The low-voltage connector unit 32 is provided in the front region of the left wall portion 311e of the intermediate member 311 so as to extend obliquely forward to the left from the left wall portion 311e of the intermediate member 311, and is fixed to the left wall portion 311e of the intermediate member 311 by bolts or the like.

In this way, since the low-voltage connector unit 32 is provided on the left wall portion 31e of the accommodating case 31 behind the front wall portion 31c of the accommodating case 31, even when an object collides with the power control unit 30 from a vehicle front side due to a frontal collision of the vehicle V or the like, the object collides with the front wall portion 31c of the accommodating case 31 before the low-voltage connector unit 32. Accordingly, even when the object collides with the power control unit 30 from the vehicle front side, damage to the low-voltage connector unit 32 can be limited.

The DCDC converter 303 is fixed to the intermediate member 311 inside the accommodating case 31.

In this way, since the DCDC converter 303 is fixed to the intermediate member 311 on which the low-voltage connector unit 32 is provided, it is possible to reduce a size of a connection member such as a bus bar that electrically connects the DCDC converter 303 to the low-voltage connector unit 32, and to facilitate assembly work when assembling the connection member to the DCDC converter 303 and the low-voltage connector unit 32.

A conductive member such as a bus bar (not shown) that connects the low-voltage connector unit 32 to the DCDC converter 303 is provided inside the accommodating case 31. The low-voltage connector unit 32 is electrically connected to the DCDC converter 303 by the conductive member.

The power control unit 30 can step down the voltage V1, which is the output voltage of the high-voltage battery, to $V_{Low}$, which is the operating voltage of each electrical component of the vehicle, by the DCDC converter 303, and output the voltage from the low-voltage connector unit 32 to the outside of the power control unit 30.

A first protruding portion 33, a second protruding portion 34, and a third protruding portion 35 are provided in the front region of the accommodating case 31. In the present embodiment, the first protruding portion 33 and the second protruding portion 34 are provided on the intermediate member 311 of the accommodating case 31, and the third protruding portion 35 is provided on the upper member 312 of the accommodating case 31.

As described above, the low-voltage connector unit 32 is provided on the intermediate member 311. Therefore, the low-voltage connector unit 32, the first protruding portion 33, and the second protruding portion 34 are all provided on the intermediate member 311 of the accommodating case 31. In this way, since the first protruding portion 33 and the second protruding portion 34 are provided on the intermediate member 311 on which the low-voltage connector unit 32 is provided, even when an object collides with the power control unit 30 from the vehicle front side due to a frontal collision of the vehicle V or the like, it is possible to prevent a load that the upper member 312 and the lower member 313 are pulled off from the intermediate member 311 from being applied to the upper member 312 and the lower member 313. Accordingly, even when the object collides with the power control unit 30 from the vehicle front side, an insulation property inside the accommodating case 31 of the power control unit 30 can be ensured.

The first protruding portion 33 is provided below the low-voltage connector unit 32 and at a position where at least a part of the first protruding portion 33 overlaps with the low-voltage connector unit 32 as viewed in the upper-lower direction, Similar to the low-voltage connector unit 32, the first protruding portion 33 is provided in the front region of the left wall portion 311e of the intermediate member 311 so as to extend obliquely forward to the left from the left wall portion 311e of the intermediate member 311. In the present embodiment, a tip end portion 33a of the first protruding portion 33 extends obliquely forward to the left to the outside of the accommodating case 31 more than the low-voltage connector unit 32. The first protruding portion 33 may be formed integrally with the intermediate member 311 of the accommodating case 31, or may be formed separately from the intermediate member 311 of the accommodating case 31 and joined to the intermediate member 311 of the accommodating case 31.

The second protruding portion 34 is provided in the vicinity of a connection portion between the front wall portion 311c and the left wall portion 311e of the intermediate member 311, that is, in the vicinity of a left front corner of the intermediate member 311. The second protruding portion 34 extends obliquely forward to the left from the vicinity of the left front corner of the intermediate member 311. The second protruding portion 34 extends from the upper end portion to the lower end portion of the intermediate member 311 over the entire region of the intermediate member 311 in the upper-lower direction in the vicinity of the left front corner of the intermediate member 311.

The low-voltage connector unit 32 is provided such that, as viewed in the upper-lower direction, the low-voltage connector unit 32 is located behind a first virtual line VL1, which is a common tangent line of the first protruding portion 33 and the second protruding portion 34, and at least a part of the low-voltage connector unit 32 is located in the left-right direction between a first contact point P1 in which the first virtual line VL1 is in contact with the first protruding portion 33, and a second contact point P2 in which the first virtual line VL1 is in contact with the second protruding portion 34.

Accordingly, when an object collides with the power control unit 30 from the vehicle front side due to a frontal collision of the vehicle V or the like, the object collides with the first protruding portion 33 and the second protruding portion 34 before the low-voltage connector unit 32. Therefore, even when the object collides with the power control unit 30 from the vehicle front side, the first protruding portion 33 and the second protruding portion 34 can prevent a load from being applied to the low-voltage connector unit 32. Accordingly, even when the object collides with the power control unit 30 from the vehicle front side, damage to the low-voltage connector unit 32 and damage to the DCDC converter 303 via the low-voltage connector unit 32 can be limited.

The third protruding portion 35 is provided on the upper member 312 above the low-voltage connector unit 32. The third protruding portion 35 is provided at a position where at least a part of the third protruding portion 35 overlaps with the low-voltage connector unit 32. In the present embodiment, the third protruding portion 35 is located at the same position as the first protruding portion 33 as viewed in the upper-lower direction, and has the same outer edge shape as the first protruding portion 33 as viewed in the upper-lower direction, Therefore, the third protruding portion 35 is provided in the front region of the upper member 312 so as to extend obliquely forward to the left from the left end portion of the upper member 312. In the present embodiment, a tip end portion of the third protruding portion 35 extends obliquely forward to the left to the outside of the accommodating case 31 more than the low-voltage connector unit 32. The third protruding portion 35 may be formed integrally with the upper member 312 of the accommodating case 31, or may be formed separately from the upper member 312 of the accommodating case 31 and joined to the upper member 312 of the accommodating case 31.

In this way the first protruding portion 33 is provided below the low-voltage connector unit 32, the third protruding portion 35 is provided on the upper member 312 above the low-voltage connector unit 32, and the first protruding portion 33 and the third protruding portion 35 are provided at positions where at least a part of each of the first protruding portion 33 and the third protruding portion 35 overlaps with the low-voltage connector unit 32 as viewed in the upper-lower direction, whereby the low-voltage connector unit 32 can be protected even when an object collides with the power control unit 30 in the upper-lower direction. In addition, the low-voltage connector unit 32 can be protected even when the power control unit 30 is displaced in the upper-lower direction due to a collision of the vehicle V or the like.

Figure 5:
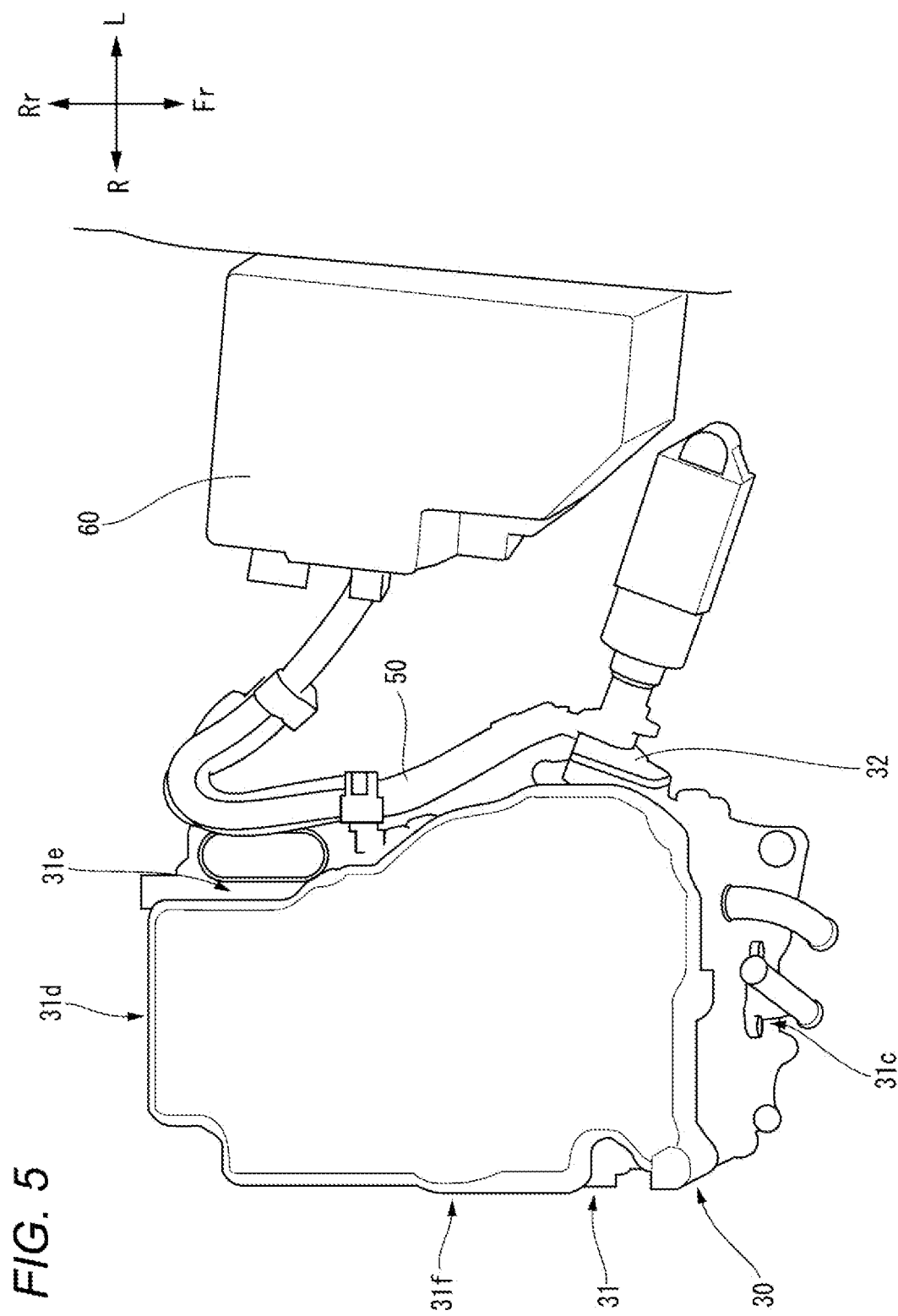
FIG. 5 is a top view of a main portion inside a front room of the vehicle in FIG. 1 as viewed from above.

As shown in FIG. 5, a DV electric wire 50 is connected to the low-voltage connector unit 32. One end portion of the DV electric wire 50 is connected to the low-voltage connector unit 32 of the power control unit 30, and the other end portion of the DV electric wire 50 is connected to a relay box 60 mounted inside the front room FRM of the vehicle V.

Power output from the low-voltage connector unit 32 of the power control unit 30 is transmitted from the DV electric wire 50 to the relay box 60, and is supplied from the relay box 60 to each electrical component mounted on the vehicle V.

Although an embodiment of the present disclosure has been described above with reference to the accompanying drawings, it is needless to say that the present invention is not limited to the embodiment. It is apparent that those skilled in the art can conceive of various modifications and changes within the scope described in the claims, and it is understood that such modifications and changes naturally fall within the technical scope of the present invention. In addition, the components in the above embodiment may be combined as desired without departing from the gist of the invention.

For example, the third protruding portion 35 may be omitted.

For example, in the present embodiment, the third protruding portion 35 is located at the same position as the first protruding portion 33 as viewed in the upper-lower direction and has the same outer edge shape as the first protruding portion 33 as viewed in the upper-lower direction, but the position and shape of the third protruding portion 35 are not limited thereto, and the third protruding portion 35 may be provided such that at least a part of the third protruding portion 35 overlaps with the low-voltage connector unit 32 as viewed in the upper-lower direction.

For example, the low-voltage connector unit 32, the first protruding portion 33, the second protruding portion 34, and the third protruding portion 35 may be provided in a front region of the right wall portion 31f of the accommodating case 31 behind the front wall portion 31c of the accommodating case 31.

In the present embodiment, the vehicle V is a so-called front wheel drive vehicle having the front wheels FW as driven wheels, but the vehicle V may be a so-called rear wheel drive vehicle having the rear wheels RW as driven wheels, or may be a so-called four wheel drive vehicle having both the front wheels FW and the rear wheels RW as driven wheels. When the vehicle V is a four wheel drive vehicle, the drive device 20 may include a drive shaft coupled to an axle of the rear wheels RW and a front differential gear that distributes a driving force to the left and right front wheels FW In this case, the drive device 20 drives the front wheels FW via the front differential gear and drives the rear wheels RW via the front differential gear and the drive shaft. The drive device 20 may include a transmission path that transmits rotational power of the engine 10 to the front wheels FW via the power transmission mechanism and transmits the rotational power of the engine 10 to the rear wheels RW via the drive shaft, and a transmission path that transmits the rotational power of the engine 10 to the first rotary electric machine via the power transmission mechanism to drive the second rotary electric machine while generating power with the first rotary electric machine, transmits rotational power of the second rotary electric machine to the front wheels FW via the power transmission mechanism and transmits the rotational power of the second rotary electric machine to the rear wheels RW via the drive shaft. In this case, the vehicle V travels by driving the front wheels FW and the rear wheels RW by selectively selecting one of the two transmission paths in the drive device 20 or using the two transmission paths in combination. When the vehicle V is the four wheel drive vehicle, the drive device 20 may include a third rotary electric machine at a rear portion of the vehicle V, and may further include a transmission path that transmits the rotational power of the engine 10 to the front wheels FW via, the power transmission mechanism to cause the vehicle V to travel, a transmission path that transmits the rotational power of the engine 10 to the first rotary electric machine via the power transmission mechanism to drive the second rotary electric machine while generating power with the first rotary electric machine and transmits rotational power of the second rotary electric machine to the front wheels FW via the power transmission mechanism to cause the vehicle V to travel, and a transmission path that transmits the rotational power of the engine 10 to the first rotary electric machine via the power transmission mechanism to drive the third rotary electric machine while generating power with the first rotary electric machine and transmits rotational power of the third rotary electric machine to the rear wheels RW to cause the vehicle V to travel. In this case, the vehicle V travels by driving the front wheels FW or both the front wheels FW and the rear wheels RW by selecting one or more of the three transmission paths in the drive device 20 or using the three transmission paths in combination.

In this specification, at least the following matters are described. In parentheses, corresponding components and the like in the above embodiment are shown as an example, but the present invention is not limited thereto.

(1) There is provided a vehicle power conversion device (power control unit 30) mounted in a front room (front room FRM) of a vehicle (vehicle V), and the vehicle power conversion device includes:

a DCDC converter (DCDC converter 303);

an accommodating case (accommodating case 31) configured to accommodate the DCDC converter; and a connector unit (low-voltage connector unit 32) provided on the accommodating case.

a first protruding portion (first protruding portion 33) and a second protruding portion (second protruding portion 34) are provided in a front region of the accommodating case,
in which the connector unit is provided such that, as viewed in an upper-lower direction, the connector unit is located behind a first virtual line (first virtual line VL1) which is a common tangent line of the first protruding portion and the second protruding portion, and at least a part of the connector unit is located in a left-right direction between a first contact point (first contact point P1) in which the first virtual line is in contact with the first protruding portion, and a second contact point (second contact point P2) in which the first virtual line is in contact with the second protruding portion.

According to (1), when an object collides with the vehicle power conversion device from a vehicle front side, the object collides with the first protruding portion and the second protruding portion collide before the connector unit. Therefore, even when the object collides with the vehicle power conversion device from the vehicle front side, the first protruding portion and the second protruding portion can prevent a load from being applied to the connector unit. Accordingly, even when the object collides with the vehicle power conversion device from the vehicle front side, damage to the connector unit and damage to the DCDC converter via the connector unit can be limited.

(2) In the vehicle power conversion device according to (1),
the connector unit is provided on a left wall portion (left wall portion 31e) or a right wall portion (right wall portion 31f) of the accommodating case behind a front wall portion (front wall portion 31c) of the accommodating case.

According to (2), since the connector unit is provided on the left wall portion or the right wall portion of the accommodating case behind the front wall portion of the accommodating case, even when an object collides with the vehicle power conversion device from the vehicle front side, the object collides with the front wall portion of the accommodating case before the connector unit. Accordingly, even when the object collides with the vehicle power conversion device from the vehicle front side, damage to the connector unit can be limited.

(3) In the vehicle power conversion device according to (1) or (2),
the accommodating case includes:
an intermediate member (intermediate member 311) configured to surround the DCDC converter as viewed in the upper-lower direction;
an upper member (upper member 312) disposed at an upper portion of the intermediate member and configured to cover an upper side of the DCDC converter; and
a lower member (lower member 313) disposed at a lower portion of the intermediate member and configured to cover a lower side of the DCDC converter, and
the connector unit, the first protruding portion, and the second protruding portion are provided on the intermediate member.

According to (3), since the first protruding portion and the second protruding portion are provided on the intermediate member on which the connector unit is provided, even when an object collides with the vehicle power conversion device from the vehicle front side, it is possible to prevent such a load that the upper member and the lower member are pulled off from the intermediate member from being applied to the upper member and the lower member. Accordingly even when the object collides with the vehicle power conversion device from the vehicle front side, an insulation property inside the accommodating case can be ensured.

(4) In the vehicle power conversion device according to (3),
the DCDC converter is fixed to the intermediate member.

According to (4), since the DCDC converter is fixed to the intermediate member on which the connector unit is provided, it is possible to reduce a size of a connection member that electrically connects the DCDC converter to the connector unit, and to facilitate assembly work when assembling the connection member to the DCDC converter and the connector unit.

(5) In the vehicle power conversion device according to (3) or (4),
a third protruding portion (third protruding portion 35) is provided in the front region of the accommodating case,
the first protruding portion is provided below the connector unit,
the third protruding portion is provided on the upper member above the connector unit, and
the first protruding portion and the third protruding portion are provided such that at least a part of each of the first protruding portion and the third protruding portion overlaps with the connector unit as viewed in the upper-lower direction.

According to (5), the connector unit can be protected even when an object collides with the vehicle power conversion device in the upper-lower direction. In addition, the connector unit can be protected even when the vehicle power conversion device is displaced in the upper-lower direction due to a collision of the vehicle or the like.

What is claimed is:
1. A vehicle power conversion device mounted in a front room of a vehicle, the vehicle power conversion device comprising:
a DCDC converter;
an accommodating case configured to accommodate the DCDC converter; and
a connector unit provided on the accommodating case,
wherein a first protruding portion and a second protruding portion are provided in a front region of the accommodating case, and
the connector unit is provided such that, as viewed in an upper-lower direction, the connector unit is located behind a first virtual line which is a common tangent line of the first protruding portion and the second protruding portion, and at least a part of the connector unit is located in a left-right direction between a first contact point in which the first virtual line is in contact with the first protruding portion, and a second contact point in which the first virtual line is in contact with the second protruding portion.

2. The vehicle power conversion device according to claim 1,
wherein the connector unit is provided on a left wall portion or a right wall portion of the accommodating case behind a front wall portion of the accommodating case.

3. The vehicle power conversion device according to claim 1,
wherein the accommodating case includes:

an intermediate member configured to surround the DCDC converter as viewed in the upper-lower direction;

an upper member disposed at an upper portion of the intermediate member and configured to cover an upper side of the DCDC converter; and a lower member disposed at a lower portion of the intermediate member and configured to cover a lower side of the DCDC converter, and the connector unit, the first protruding portion, and the second protruding portion are provided on the intermediate member.

4. The vehicle power conversion device according to claim 3, wherein the DCDC converter is fixed to the intermediate member.

5. The vehicle power conversion device according to claim 3, wherein a third protruding portion is provided in the front region of the accommodating case, the first protruding portion is provided below the connector unit, the third protruding portion is provided on the upper member above the connector unit, and the first protruding portion and the third protruding portion are provided such that at least a part of each of the first protruding portion and the third protruding portion overlaps with the connector unit as viewed in the upper-lower direction.

6. The vehicle power conversion device according to claim 4, wherein a third protruding portion is provided in the front region of the accommodating case, the first protruding portion is provided below the connector unit, the third protruding portion is provided on the upper member above the connector unit, and the first protruding portion and the third protruding portion are provided such that at least a part of each of the first protruding portion and the third protruding portion overlaps with the connector unit as viewed in the upper-lower direction.

* * * * *